United States Patent
Leung et al.

(10) Patent No.: US 6,442,060 B1
(45) Date of Patent: Aug. 27, 2002

(54) HIGH-DENSITY RATIO-INDEPENDENT FOUR-TRANSISTOR RAM CELL FABRICATED WITH A CONVENTIONAL LOGIC PROCESS

(75) Inventors: Wingyu Leung, Cupertino; Fu-Chieh Hsu, Saratoga, both of CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/568,088

(22) Filed: May 9, 2000

(51) Int. Cl.[7] .............................................. G11C 11/00
(52) U.S. Cl. ...................................... 365/154; 365/205
(58) Field of Search .................................. 365/154, 205

(56) References Cited

U.S. PATENT DOCUMENTS

| | | | | |
|---|---|---|---|---|
| 3,949,383 A | * | 4/1976 | Askin et al. ................. | 340/173 |
| 4,023,149 A | * | 5/1977 | Bormann et al. ........... | 340/124 |
| 4,794,561 A | * | 12/1988 | Hsu ........................... | 365/182 |
| 4,876,215 A | * | 10/1989 | Hsu ........................... | 437/60 |
| 5,020,028 A | * | 5/1991 | Wanlass ..................... | 365/154 |
| 5,047,979 A | * | 9/1991 | Leung ........................ | 365/154 |
| 5,265,047 A | * | 11/1993 | Leung et al. ............... | 365/154 |

OTHER PUBLICATIONS

Takeda et al., "A 16Mb 400 MHz Loadless CMOS Four–Transistor SRAM Macro," ISSCC 2000, pp. 264–265, (Feb. 8, 2000).

* cited by examiner

*Primary Examiner*—M. Tran
(74) *Attorney, Agent, or Firm*—E. Eric Hoffman; Law Offices of Bever, Hoffman & Harms, LLP

(57) ABSTRACT

A four-transistor RAM cell is provided by a pair of cross-coupled driver transistors configured to store a data value, and a pair of access transistors coupled to the driver transistors. The driver transistors and access transistors are sized so the driver transistors are not stronger than the access transistors. In one embodiment, the driver transistors are PMOS transistors and the access transistors are NMOS transistors, with these transistors all having substantially the same size. These PMOS and NMOS transistors are fabricated using a conventional ASIC or logic process. The PMOS transistors are located in an N-well, which is biased at a voltage greater than the $V_{CC}$ supply voltage. The gates of the access transistors are coupled to a word line, and the sources of the access transistors are coupled to a pair of bit lines. The bit lines are coupled a regenerative sense amplifier and a bit line equalization circuit.

30 Claims, 4 Drawing Sheets

HIGH-DENSITY RATIO-INDEPENDENT FOUR-TRANSISTOR RAM CELL FABRICATED WITH A CONVENTIONAL LOGIC PROCESS

FIELD OF THE INVENTION

The present invention relates to random access memory (RAM). More particularly, this invention relates to high-density ratio-independent RAM cells and related circuitry that are fabricated using conventional ASIC or logic processes.

RELATED ART

For system-on-chip (SOC) applications, it is desirable to integrate many functional blocks into a single integrated circuit. The most commonly used blocks include a microprocessor or micro-controller, random access memory (RAM) blocks and various special function logic blocks. To reduce the cost of SOC, it is important to maximize the density of the RAM blocks fabricated using a conventional ASIC or logic process. In the present specification, a conventional logic process is defined as a semiconductor process that implements single-well or twin-well technology and uses a single layer of polysilicon.

Traditional static RAM (SRAM) uses either 4 transistors and 2 resistors (4T-2R) in each memory cell or 6 transistors (6T) in each memory cell as shown in FIGS. 1 and 2 respectively. The 4T-2R cell 100 shown in FIG. 1 includes n-channel access transistors 101–102, n-channel driver transistors 103–104 and load resistors 105–106. Load resistors 105–106 are typically polysilicon elements that require special processing, which is generally not available in a conventional ASIC or logic process. The CMOS 6T cell 200 shown in FIG. 2 includes n-channel access transistors 201–202, n-channel driver transistors 203–204 and p-channel pull-up transistors 205–206. CMOS 6T cell 200 is commonly used, but the large cell size, due to the use of both PMOS and NMOS transistors, limits the density of an array formed using these 6T cells.

To reduce the RAM cell size, resistors 105–106 of 4T-2R cell 100, or pull-up transistors 205–206 of 6T cell 200 can be eliminated to create the 4T RAM cell 300 shown in FIG. 3. 4T cell 300 includes n-channel access transistors 301–302 and n-channel driver transistors 303–304. An internal "high" voltage level is stored on one of nodes $N_A$ or $N_B$ of cell 300, and an internal "low" voltage level is stored on the other one of nodes $N_A$ or $N_B$. The internal "high" voltage level on node $N_A$ or $N_B$ of cell 300 can only reach the level of word line (WL) turn-on voltage applied to the gates of access transistors 301–302 minus one threshold voltage ($V_T$). The internal "high" voltage level can be substantially lower than the $V_{CC}$ supply voltage.

Because 4T RAM cell 300 is constructed with four transistors of the same polarity, significant leakage currents exist in cell 300. In a conventional ASIC or logic process, these leakage currents can include sub-threshold leakage, junction leakage and gate tunneling leakage currents. These leakage currents necessitate frequent refresh operations to restore the internal "high" voltage level stored on node N1 or N2 of cell 300. Thus, cell 300 is a dynamic random access memory (DRAM) cell. Bias and refresh techniques which are used to prevent the complete loss of the internal "high" voltage level are described in U.S. Pat. No. 3,949,383 entitled "D.C. Stable Semiconductor Memory Cell" by H. O. Askin et al., U.S. Pat. No. 4,023,149 entitled "Static Storage Technique For Four Transistor IGFET Memory Cell" by A. R. Bormann et al., and U.S. Pat. No. 5,020,028 entitled "Four Transistor Static RAM Cell" by Frank Wanlass.

While the internal "high" voltage level on node N1 or N2 of cell 300 is being replenished, the leakage current through the other node (i.e., the "low" voltage node) can be several orders of magnitude higher than the normal leakage current, thereby resulting in very high standby current consumption.

In an attempt to overcome these problems, a larger 4T CMOS cell has been proposed by K. Takeda et al. in "A 16 Mb 400 MHz Loadless CMOS Four-Transistor SRAM Macro", ISSCC 2000, pp. 264–265, Feb. 8, 2000. FIG. 4 illustrates this 4T CMOS cell 400, which includes PMOS access transistors 401–402 and NMOS driver transistors 403–404. The internal "high" voltage level on node $N_C$ or $N_D$ of cell 400 is maintained through sub-threshold leakage current through access PMOS transistors 401–402, which is created by pre-charging the bit lines (BL and BL#) to the $V_{CC}$ supply voltage.

Because an NMOS transistor is typically 3 times stronger than a PMOS transistor with the same drawn dimensions, CMOS-4T cell 400 can satisfy the cell stability requirements of standard SRAM read operations, which specify that the driver transistor should be 3 times the strength of the access transistor or more. This cell stability requirement is discussed in detail in U.S. Pat. No. 5,047,979 entitled "High Density SRAM Circuit With Ratio Independent Memory Cells" by Wingyu Leung.

One significant drawback of 4T CMOS cell 400 is that the gate tunneling current can be very high across the gate oxide of a turned-on NMOS transistor, particularly when the gate oxide has a thickness of 4 nm or less, as is the case in a conventional 0.18 micron ASIC or logic process. This high gate tunneling current exists due to very high electron density at either side or both sides of the thin gate dielectric. This high electron density will exist at the node ($N_C$ or $N_D$) that stores the internal "high" voltage level, and is replenished by the sub-threshold leakage current through the corresponding PMOS transistor.

Another drawback of 4T RAM cell 400 is that the sub-threshold leakage currents of PMOS transistors 403–404 decrease rapidly as the temperature decreases, while the tunneling current changes slowly as the temperature decreases, thereby making 4T RAM cell 400 unstable at lower temperatures.

In the implementation of high density RAM, the cell size is one of the more critical parameters, as the cell size determines the total area of the memory array and therefore the chip size. In conventional planar layouts, the size of the driver transistors account for a significant portion of the cell area. This is because, the size of the driver transistor has had to be around three times the size of the access transistor (assuming that the driver transistor and the access transistor have the same conductivity type) to prevent the state of the cell from being upset when the access transistor is turned on during a read operation. (See, U.S. Pat. Nos. 4,794,561 and 4,876,215 by Fu-Chieh Hsu).

It would therefore be desirable to have a ratio-independent SRAM cell that has an improved gate tunneling current limitation, and having a layout area suitable for providing high-density RAM blocks using a conventional ASIC or logic process.

SUMMARY

Accordingly, the present invention provides a four-transistor (4T) static random access memory (SRAM) cell having a pair of cross-coupled driver transistors configured to store a data value, and a pair of access transistors coupled to the driver transistors. The driver transistors and access transistors are sized such that the driver transistors are less than three times stronger than the access transistors. In a particular embodiment, the driver transistors are not stronger than the access transistors. Because the driver transistors are not required to be stronger than the access transistors, the resulting 4T SRAM cell is a ratio-independent memory cell. In one embodiment, the driver transistors are PMOS transistors and the access transistors are NMOS transistors, with all of these transistors having substantially the same size. The PMOS and NMOS transistors are fabricated using a conventional ASIC or logic process. As a result, the 4T SRAM cell can be easily incorporated into a system-on-a-chip architecture. In one embodiment, the NMOS and PMOS transistors are all fabricated with a channel length equal to the minimum channel length available with the process, a channel width equal to the minimum channel width available with the process. As a result, the layout area of the 4T SRAM cell is advantageously minimized.

In one embodiment, a first PMOS driver transistor is coupled between the $V_{CC}$ voltage supply terminal and a first node (N1), and a second PMOS driver transistor is coupled between the $V_{CC}$ voltage supply terminal and a second node (N2). A first NMOS access transistor is coupled between the first node N1 and a first bit line, and a second NMOS access transistor is coupled between the second node N2 and a second bit line. The gates of the NMOS access transistors are coupled to a word line.

The PMOS driver transistors can be located in an N-well, which is coupled to receive a voltage greater than a $V_{CC}$ supply voltage. This applied voltage advantageously provides a back-bias effect that raises the threshold voltage ($V_T$) of the PMOS driver transistors, thereby decreasing the sub-threshold leakage of the PMOS transistors and thus the standby current of the cell.

When a data value is stored in the 4T SRAM cell, one of nodes N1–N2 is held at a logic high voltage, and the other one of nodes N1–N2 is held at a logic low voltage. For example, node N1 can have a logic high voltage and node N2 can have a logic low voltage. When the 4T SRAM cell is not being accessed, the word line is held at a ground voltage. At this time, the bit lines are held at ground potential by a bit line equalization circuit. Under these conditions, the low voltage on node N2 is held at a voltage approximately equal to the ground voltage by the relatively large sub-threshold leakage current and junction leakage current through the second NMOS access transistor. In this manner, the relatively weak NMOS access transistors contribute to the stability of the 4T SRAM cell. The low voltage on node N2 causes the first PMOS driver transistor to turn on, thereby keeping the potential at node N1 close to the $V_{CC}$ supply voltage.

The bit lines are also coupled to a differential regenerative sense amplifier. To read a data value from the 4T SRAM cell, the bit line equalization circuit is deactivated thereby isolating the pre-charged bit lines from the ground supply terminal. A word line voltage is then asserted on the word line, thereby turning on the NMOS access transistors. At this time, a differential voltage representative of the data value stored in the 4T SRAM cell is developed on the bit lines. The differential regenerative sense amplifier is then enabled. In response to the differential voltage across the bit lines, the differential regenerative sense amplifier pulls up one bit line to the $V_{CC}$ supply voltage, and pulls down the other bit line to the ground potential. At the end of the read cycle, the word line is turned off before the sense amplifier is disabled. As a result, the sense amplifier provides fully developed complementary bit line voltages to the internal nodes of the 4T SRAM cell, thereby causing the data value read from the 4T SRAM cell to be written back to the 4T SRAM cell.

The present invention will be more fully understood in view of the following description and drawings.

DETAILED DESCRIPTION

Figure 1:
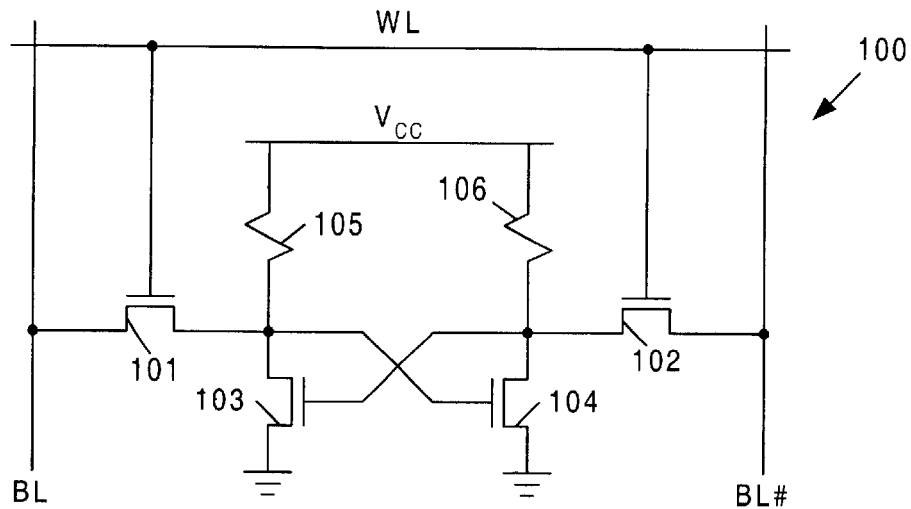
FIG. 1 is a circuit diagram of a conventional 4T-2R SRAM cell.
Figure 2:
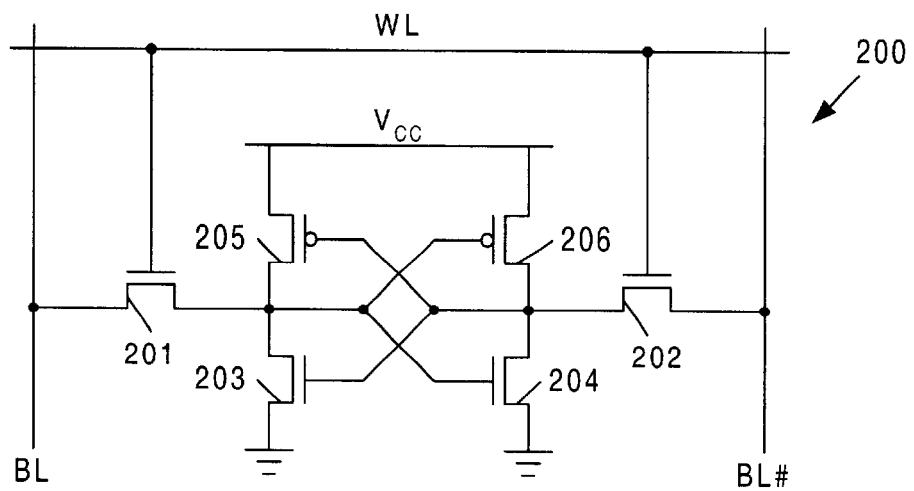
FIG. 2 is a circuit diagram of a conventional CMOS 6T SRAM cell.
Figure 3:
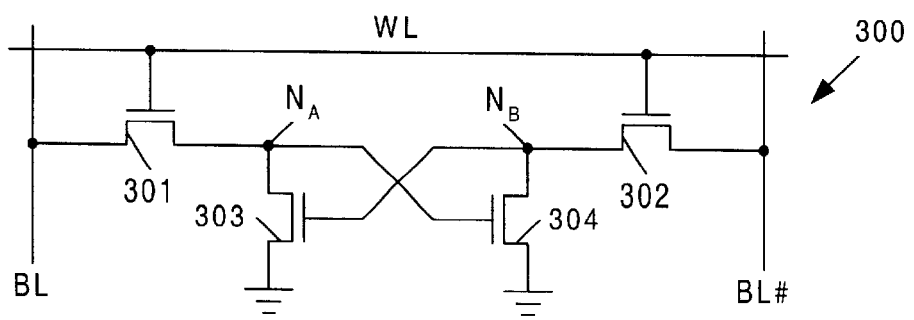
FIG. 3 is a circuit diagram of a conventional 4T DRAM cell.
Figure 4:
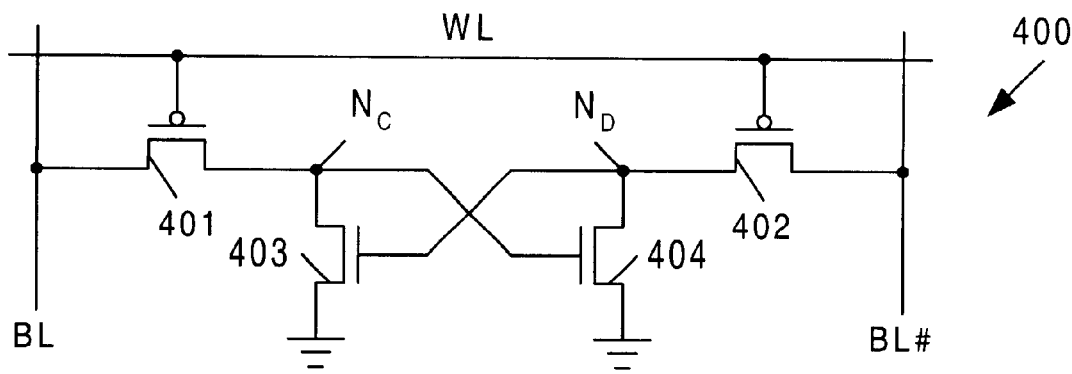
FIG. 4 is a circuit diagram of a conventional CMOS 4T SRAM cell.
Figure 5:
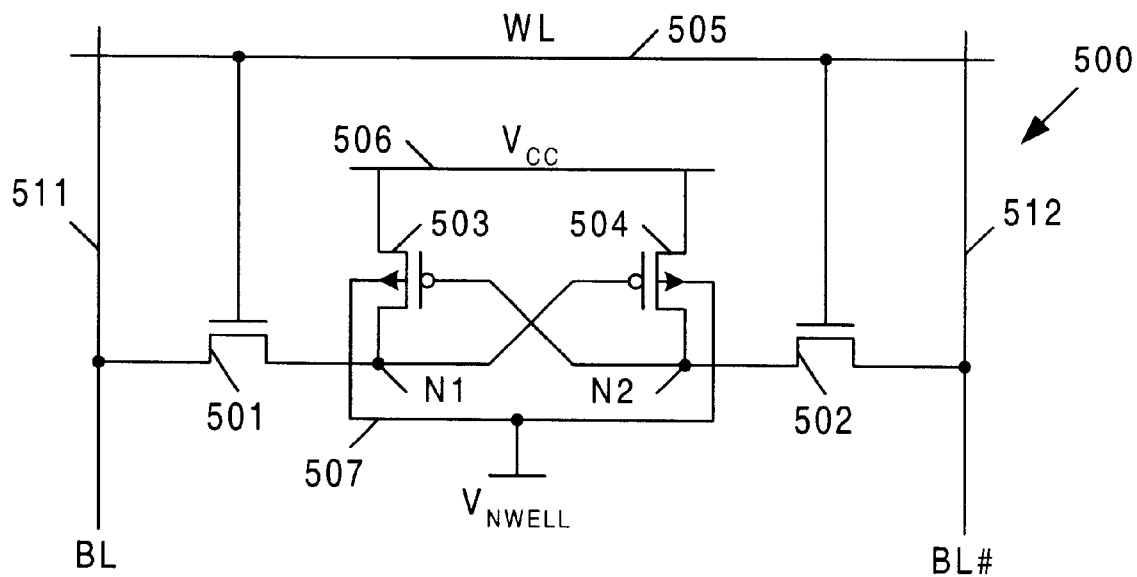
FIG. 5 is a circuit diagram of a ratio-independent 4T SRAM cell constructed using CMOS transistors in accordance with one embodiment of the present invention.

FIG. 5 is a circuit diagram of a 4T SRAM cell 500 in accordance with one embodiment of the present invention. 4T SRAM cell 500 includes NMOS access transistors 501–502 and PMOS driver transistors 503–504, which are fabricated using a conventional ASIC or logic process. In the described example, cell 500 is constructed using a 0.18 micron n-well process. The gates of access transistors 501–502 are commonly connected to a word line 505. The drains of access transistors 501–502 are connected to bit line 511 and complementary bit line 512, respectively. PMOS transistor 503 is connected between the $V_{CC}$ voltage supply terminal 506 and the source of access transistor 501 at node N1. PMOS transistor 504 is connected between the $V_{CC}$ voltage supply terminal 506 and the source of access transistor 502 at node N2. The $V_{CC}$ voltage supply terminal 506 is coupled to receive a $V_{CC}$ supply voltage. In the described example, the $V_{CC}$ supply voltage has a nominal voltage of 1.8 Volts. PMOS driver transistors 503–504 are cross-coupled, such that the gates of transistors 503–504 are coupled to nodes N2 and N1, respectively. PMOS transistors 503–504 are fabricated in an n-type well region 507, which is coupled to receive a well bias voltage $V_{NWELL}$. As described in more detail below, cell 500 stores an internal high voltage on one of nodes N1 and N2, and an internal low voltage on the other one of nodes N1 and N2.

In the described embodiment, to minimize the size of cell 500, NMOS transistors 501–502 and PMOS transistors 503–504 are all drawn to approximately the same size (i.e., channel width and channel length), with the channel length and width being the minimum allowed by the process. For example, the channel length can be 0.18 microns and the channel width can be 0.4 microns. As a result of the similar sizes of the PMOS and NMOS transistors, the strength of the NMOS access transistors 501–502 are significantly higher than the strength of the PMOS driver transistors 503–504. Note that this is contrary to conventional SRAM cells, wherein the strength of the driver transistors is typically much greater than (3×) the strength of the access transistors, in order to maintain cell stability during read operations. In accordance with the present invention, the PMOS driver transistors 503–504 are less than three times stronger than the NMOS access transistors 501–502. In the described embodiment, PMOS transistors 503–504 are not stronger than the NMOS access transistors 501–502. For this reason, the resulting 4T SRAM cell 500 is referred to as a "ratio independent" cell.

PMOS driver transistors 503 and 504 each have a gate dielectric thickness of approximately 4 nm in the described embodiment. However, the gate tunneling current in the turned-on PMOS driver transistor 503 or 504 is relatively low due to the absence of electrons on both sides of the thin gate dielectric of the PMOS transistor. Holes, rather than electrons, are prominent in the channel region of the turned on PMOS driver transistor. Because holes have a larger effective mass than electrons, there is a substantially smaller probability of the holes tunneling across the thin gate dielectric of PMOS driver transistors 503–504.

In the described embodiment, the n-well bias voltage $V_{NWELL}$ is maintained at the $V_{CC}$ supply voltage or a boosted voltage greater than the $V_{CC}$ supply voltage. In the latter case, the boosted n-well bias provides an additional back-bias effect for raising the threshold voltage ($V_T$) of the PMOS driver transistors 503–504, thereby minimizing the sub-threshold leakage of the PMOS driver transistors.

Also in the described embodiment, bit lines 511 and 512 are pre-charged to the $V_{SS}$ supply voltage (e.g., 0 Volts) when cell 500 is in a standby mode. Under these conditions, a sub-threshold leakage current flows through NMOS transistors 501 and 502 to replenish the internal charge on the node (N1 or N2) that stores the internal low voltage.

Figure 6:
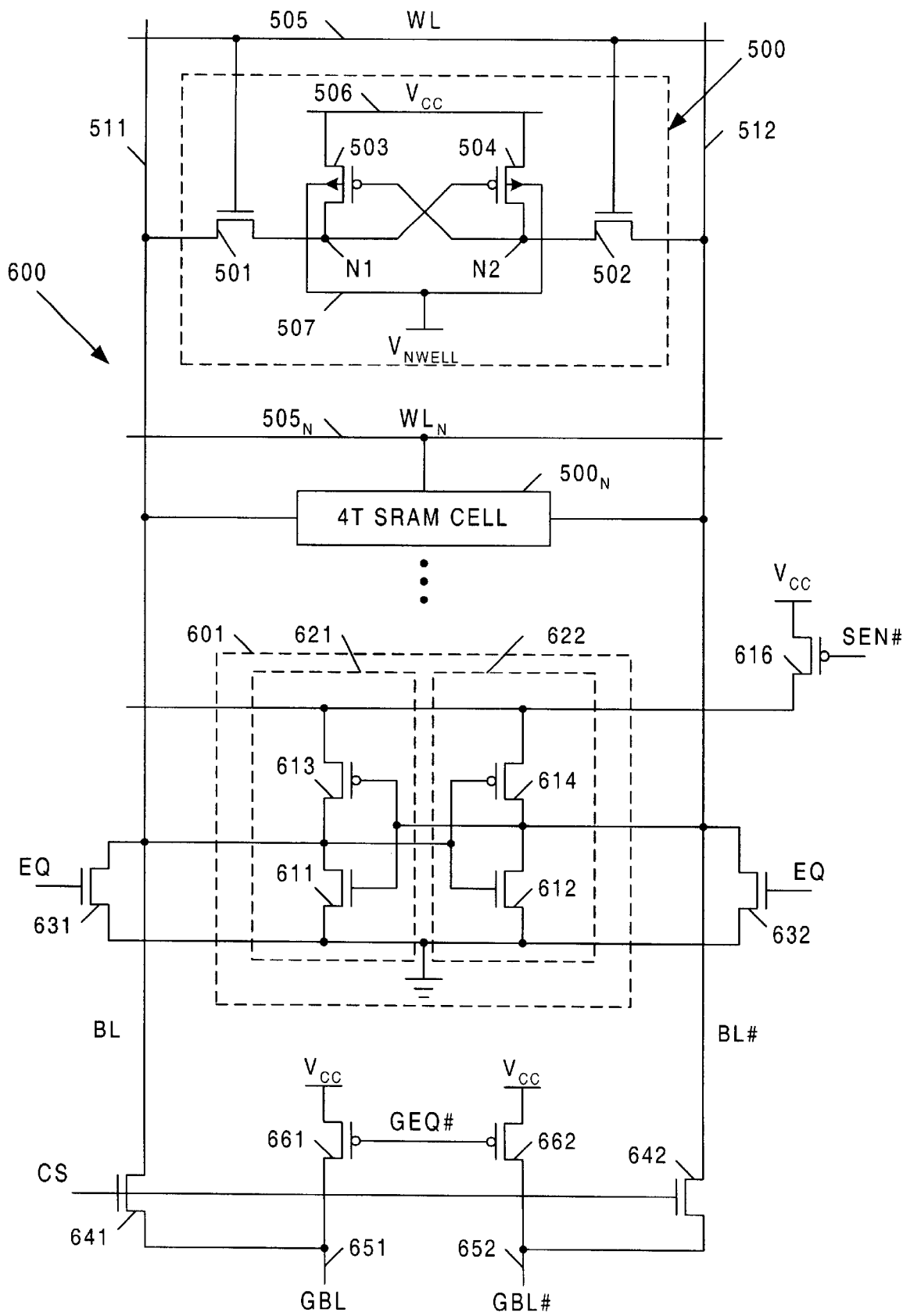
FIG. 6 is a circuit diagram of a column of a memory array that incorporates the 4T SRAM cell of FIG. 5.

FIG. 6 is a circuit diagram of a memory array column 600 that incorporates RAM cell 500. One or more additional 4T SRAM cells identical to RAM cell 500, such as 4T SRAM cell $500_N$, are connected to bit lines 511 and 512, thereby forming a column of 4T SRAM cells. Each additional 4T SRAM cell in the column has a corresponding word line. Thus, 4T SRAM cell $500_N$ is coupled to corresponding word line $505_N$.

Memory array column 600 further includes a differential regenerative sense amplifier circuit 601, which includes NMOS transistors 611–612 and PMOS transistors 613–614. Regenerative sense amplifier circuit 601 is enabled and disabled by PMOS pull-up transistor 616.

NMOS transistor 611 and PMOS transistor 613 are connected to form a first inverter 621 having an input terminal coupled to bit line 512 and an output terminal coupled to bit line 511. Similarly, NMOS transistor 612 and PMOS transistor 614 are connected to form a second inverter 622 having an input terminal coupled to bit line 511 and an output terminal coupled to bit line 512. Inverters 621 and 622 are therefore cross-coupled to form a regenerative latch circuit.

PMOS transistors 613–614 of regenerative sense amplifier circuit 601 are coupled to the $V_{CC}$ voltage supply terminal through PMOS pull-up transistor 616. NMOS transistors 611–612 of regenerative sense amplifier circuit 601 are coupled directly to the $V_{SS}$ voltage supply terminal. The gate of transistor 616 is coupled to receive sense amplifier enable signal SEN#. When the SEN# signal is asserted to a logic "0" value, transistor 616 is turned on, thereby enabling regenerative sense amplifier circuit 601. Conversely, when the SEN# signal is de-asserted to a logic "1" value, transistor 616 is turned off, thereby disabling regenerative sense amplifier circuit 601.

Memory array column 600 further includes a local bit line equalization (pre-charge) circuit which includes NMOS transistors 631 and 632, which are connected between bit lines 511 and 512, respectively, and the $V_{SS}$ voltage supply terminal. An equalization control line for receiving an equalization control signal (EQ) is connected to the gates of NMOS transistors 631 and 632.

Memory array column 600 further includes column select switches that are formed by NMOS transistors 641 and 642. Column select switches 641–642 couple the differential signals on bit lines 511–512 to global bit lines 651–652, respectively. Global bit lines 651–652 carry the global bit line signals GBL and GBL#, respectively. The gates of column switches 641–642 are coupled to receive a column select signal (CS). When the CS signal is asserted high, transistors 641–642 are turned on, thereby connecting bit lines 511–512 to global bit lines 651–652, respectively. When the CS signal is de-asserted low, transistors 641–642 are turned off, thereby isolating bit lines 511 and 512 from global bit lines 651–652. Multiple columns, similar to column 600, can be connected to global bit lines 651–652 through separate column select switches, with the separate column select switches being controlled by different column select signals.

Global bit line equalization transistors 661–662 are PMOS transistors coupled between global bit lines 651–652 and the $V_{CC}$ voltage supply terminal. The gates of transistors 661–662 are coupled to receive a global bit line equalization signal GEQ#. When the GEQ# signal is asserted low, transistors 661–662 are turned on, thereby applying the $V_{CC}$ supply voltage to global bit lines 651–652. When the GEQ# signal is de-asserted high, transistors 661–662 are turned off, thereby isolating the global bit lines from the $V_{CC}$ supply voltage.

Figure 7:
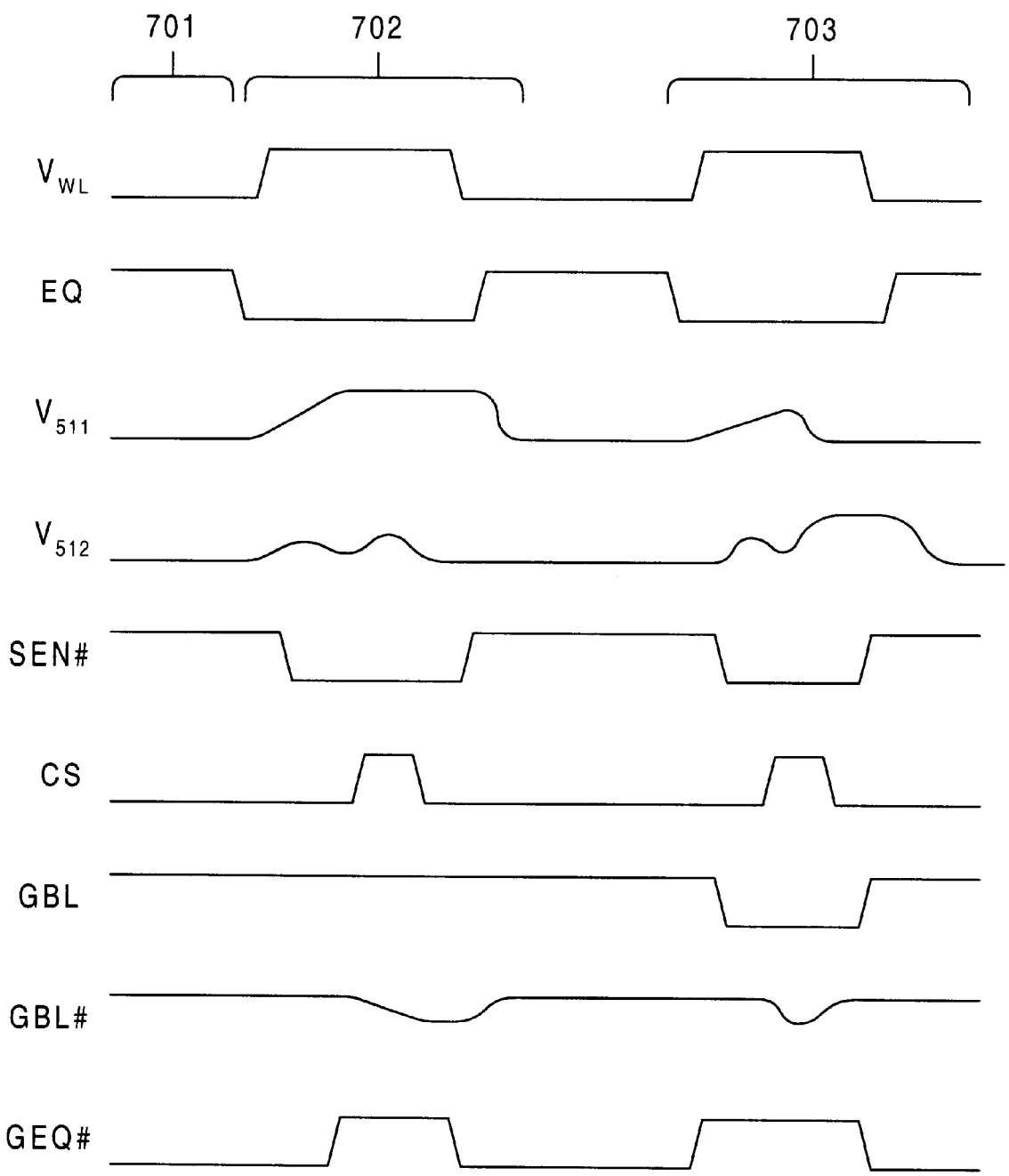
FIG. 7 is a waveform diagram illustrating the operation of the memory array column of FIG. 6 in accordance with one embodiment of the present invention.

FIG. 7 is a waveform diagram illustrating the operation of memory array column 600 in accordance with one embodiment of the present invention. Memory array column 600 operates as follows.

When there is no access to memory array column 600 (i.e., during a standby condition), all word lines of the column are turned off (i.e., held at the ground voltage). In addition, the EQ signal is asserted high, thereby turning on equalization transistors 631 and 632 and pre-charging bit lines 511 and 512 to the ground potential. The CS signal is de-asserted low, thereby turning off column select transistors 641–642 and isolating bit lines BL and BL# from global bit lines GBL and GBL#. The GEQ# signal is asserted low, thereby turning on global equalization transistors 661–662 and pre-charging global bit lines 651–652 to the $V_{CC}$ supply voltage. The SEN# signal is de-asserted high, thereby turning off transistor 616 and disabling sense amplifier 601.

A standby condition exists during period 701 of FIG. 7. At this time, the data values previously stored in the memory cells of memory array column 600 are maintained without the need for a refresh operation. 4T SRAM cell 500 (as well as the other 4T SRAM cells in memory array column 600) retain data in the following manner during a standby condition.

Assuming that a logic "1" value is stored in memory cell 500, node N1 has a logic high voltage and node N2 has a logic low voltage. When cell 500 is not accessed, word line 505 is driven to the ground potential, thereby turning off NMOS access transistors 501–502. The low voltage on node N2 is kept close to the ground potential by a relatively large sub-threshold leakage current through NMOS access transistor 502. This leakage current is approximately 2 to 5 times greater than the sub-threshold leakage current and source junction leakage current of PMOS driver transistor 504. The low voltage at node N2 keeps PMOS driver transistor 503 turned on, which in turn keeps the potential at node N1 close to the $V_{CC}$ supply voltage.

If a more advanced process, such as a 0.12 micron logic process is used to fabricate memory cell 500, then transistors 501–504 will have thin gate oxide layers, with a thickness of less than 2.5 nm. In this case, the gate tunneling current through PMOS driver transistor 504 will be relatively high. To keep the voltage at node N2 low, the sub-threshold leakage of NMOS access transistor 502 has to be greater than the gate tunneling current of PMOS driver transistor 504, plus the sub-threshold leakage current through PMOS driver transistor 504, plus the junction leakage at the source of PMOS driver transistor 504. This can be accomplished by raising the voltage of word line 505 during standby conditions slightly above the ground potential, thereby increasing the sub-threshold leakage of NMOS access transistor 502. For example, the voltage of word line 505 can be increased to 0.1 to 0.4 Volts during standby conditions.

A read operation of the logic "1" value stored in memory cell 500 is illustrated during period 702 of the waveform diagram of FIG. 7. At the beginning of the read cycle, the equalization signal EQ is de-activated low, thereby turning off equalization transistors 631 and 632. At this time, bit lines 511 and 512 are both pre-charged to the ground potential. Word line 505 is then activated high, thereby coupling nodes N1 and N2 to bit lines 511 and 512, respectively. As a result, bit line 511 begins to charge to the logic high potential stored on node N1, and bit line 512 begins to discharge to the logic low potential stored on node N2. A small differential voltage level is therefore developed across bit lines 511 and 512, with the voltage on bit line 511 being greater than the voltage on bit line 512. Next, the SEN# signal is activated low, thereby turning on differential regenerative sense amplifier 601. The high differential voltage developed on bit line 511 is provided to the input terminal of inverter 622, and the low differential voltage developed on bit line 512 is provided to the input terminal of inverter 621. In response, regenerative sense amplifier 601 is driven to a state that corresponds with the state of the binary bit of information stored in RAM cell 500. More specifically, pull-down transistor 612 is turned on, thereby pulling down node N2 to the $V_{SS}$ supply voltage. In addition, pull-up transistor 613 is turned on, thereby pulling up node N1 to the $V_{CC}$ supply voltage. The voltages on nodes N1 and N2 follow the voltages on bit lines 511 and 512, respectively. PMOS transistor 503 pulls the voltage on node N1 up to the $V_{CC}$ supply voltage after bit line 511 pulls the voltage on node N1 up to the $V_{CC}$ supply voltage minus the threshold voltage ($V_T$) of NMOS access transistor 501.

After the SEN# signal is activated low, the GEQ# signal is driven high, thereby turning off transistors 661–662 and isolating the global bit lines 651–652 from the $V_{CC}$ supply voltage. The global bit lines 651–652 are initially pre-charged to the $V_{CC}$ supply voltage. The CS signal is then driven high, thereby turning on column select transistors 641–642, and coupling bit lines 511 and 512 to global bit lines 651–652, respectively. At this time, sense amplifier 601 pulls global bit line 652 toward the ground potential. A data amplifier (not shown) amplifies the differential signal on global bit lines 651–652 to a differential signal having an amplitude substantially equal to the $V_{CC}$ supply voltage. Data is then transferred from the data amplifier to the output of the memory block.

At the end of the read cycle, the CS signal is driven low, thereby turning off column select switches 641–642 and de-coupling bit lines 511–512 from global bit lines 651–652. Word line 505 is then driven low, thereby turning off NMOS access transistors 501–502 and de-coupling nodes N1 and N2 from bit lines 511 and 512. The GEQ# signal is also driven low, thereby turning on transistors 661–662 and pre-charging global bit lines 651–652 to the $V_{CC}$ supply voltage. The SEN# signal is then de-activated high, thereby turning off sense amplifier 601. Subsequently, the EQ signal is driven high, thereby turning on equalization transistors 631–632 and pre-charging bit lines 511 and 512 to the ground potential.

Because the full $V_{CC}$ supply voltage is developed on bit line 511 during the read operation, the regenerative sense amplifier 601 effectively "rewrites" the state of the binary bit of information back into cell 500 during the read operation.

It is important to note that, due to the regenerative nature of regenerative sense amplifier 601 and the differential nature of the signals driving the inputs of sense amplifier 601, the sense amplifier 601 speeds up the development of signals on bit lines 511–512. Further, the sense amplifier 601 amplifies the small differential potential levels developed on the bit lines 511–512 to full logic levels. Finally, sense amplifier 601 provides a high drive capability for buffering the read data to the highly capacitive global bit line.

A write operation of a logic "0" value to memory cell 500 is illustrated during period 703 of the waveform diagram of FIG. 7. At the beginning of the write cycle, the EQ signal is driven low, thereby turning off equalization transistors 631–631 and de-coupling bit lines 511–512 from the ground terminal. Word line 505 is then driven high, thereby turning on NMOS access transistors 501–502 and coupling nodes N1 and N2 to bit lines 511–512, respectively. The SEN# signal is then driven low, thereby turning on sense amplifier 601. In response, sense amplifier 601 amplifies the differential signal on bit lines 511 and 512. At the same time, the GEQ# signal is driven high, thereby turning off transistors 661–662 and de-coupling global bit lines 651–652 from the $V_{CC}$ supply voltage. A write driver (not shown) then drives global bit lines 651 and 652 to ground and $V_{CC}$ potentials, respectively.

The column select signal CS is then driven high, thereby turning on column select transistors 631–632 and coupling global bit lines 651–652 to bit lines 511–512, respectively. The signals provided on the global bit lines 651–652 by the write driver are strong enough to overcome the voltages on bit lines 511–512. As a result, bit line 511 is pulled down to the ground potential, and bit line 512 is pulled up toward the $V_{CC}$ supply voltage. The regenerative characteristic of sense amplifier 601 pulls bit line 512 up to a potential substantially equal to the $V_{CC}$ supply voltage. The $V_{CC}$ supply voltage applied to bit line 512 is transmitted to node N2 through turned on access transistor 502. The voltage on node N2 causes PMOS driver transistor 503 to turn off, thereby isolating node N1 from the $V_{CC}$ supply terminal 506. The $V_{SS}$ supply voltage applied to bit line 511 is transmitted to node N1 through turned on access transistor 501. The voltage on node N1 causes PMOS driver transistor 504 to turn on, thereby coupling node N2 to $V_{CC}$ supply terminal 506.

At the end of the write cycle, the CS signal is driven low, thereby turning off column select switches 631–632 and de-coupling global bit lines 651–652 from bit lines 511–512. The WL signal is then driven low, thereby turning off NMOS access transistors 501–502 and de-coupling nodes N1–N2 from bit lines 511–512. The SEN# signal is then driven high, thereby turning off transistor 616 and disabling sense amplifier 601. At the same time, the write driver is disabled and the GEQ# signal is driven low, thereby pre-charging global bit lines 651–652 to the $V_{CC}$ supply voltage. Subsequently, the EQ signal is driven high, thereby turning on transistors 631–632 and pre-charging bit lines 511–512 to the ground potential. At this time, memory array column 600 is ready for another access cycle.

Note that a logic "1" value can be written to memory cell 500 by modifying the above-described write procedure such that the $V_{CC}$ supply voltage is applied to bit line 511 and the $V_{SS}$ supply voltage is applied to bit line 512. At the conclusion of such a write operation, transistor 503 is turned on and transistor 504 is turned off, such that nodes N1 and N2 are maintained at high and low voltages, respectively.

Also note that other memory cells (not shown) in the same row as memory cell 500, which also have access transistors coupled to word line 505, can be written at the same time as memory cell 500. In addition, other cells in the same column as memory cell 500, such as cell 500$_N$, are written in a similar manner.

Although the invention has been described in connection with several embodiments, it is understood that this invention is not limited to the embodiments disclosed, but is capable of various modifications which would be apparent to a person skilled in the art. For example, the access transistors can be PMOS transistors and the drive transistors can be NMOS transistors when using a processing technology which provides NMOS transistors that are less than three times stronger than similarly sized PMOS transistors. In this embodiment, the bit lines are equalized to the $V_{CC}$ potential, rather than the ground potential. A regenerative sense amplifier is used to restore the full node potentials in the memory cell during a read or write operation. Thus, the invention is limited only by the following claims.

What is claimed is:

1. A four-transistor (4T) static random access memory (SRAM) cell comprising:
   a pair of cross-coupled driver transistors configured to store a data value; and
   a pair of access transistors coupled to the pair of cross-coupled driver transistors, wherein the driver transistors have a first strength and the access transistors have a second strength, wherein the first strength is less than three times the second strength.

2. The 4T SRAM cell of claim 1, wherein the driver transistors are PMOS transistors.

3. The 4T SRAM cell of claim 2, wherein the PMOS transistors are located in an N-well which is coupled to receive a voltage greater than a $V_{CC}$ supply voltage.

4. The 4T SRAM cell of claim 2, wherein the access transistors are NMOS transistors.

5. The 4T SRAM cell of claim 4, wherein the PMOS transistors and the NMOS transistors are approximately the same size.

6. The 4T SRAM cell of claim 5, wherein the PMOS and NMOS transistors have channel widths that correspond with a minimum channel width of a process used to fabricate the 4T SRAM cell.

7. The 4T SRAM cell of claim 1, wherein the access transistors are NMOS transistors.

8. The 4T SRAM cell of claim 1, further comprising a $V_{CC}$ voltage supply terminal for receiving a $V_{CC}$ supply voltage, wherein the cross-coupled driver transistors comprise:
   a first PMOS transistor having a gate, a source and a drain, the source of the first PMOS transistor being coupled to the $V_{CC}$ voltage supply terminal; and
   a second PMOS transistor having a gate, a source and a drain, the source of the second PMOS transistor being coupled to the $V_{CC}$ voltage supply terminal, the gate of the second PMOS transistor being coupled to the drain of the first PMOS transistor, and the drain of the second PMOS transistor being coupled to the gate of the first PMOS transistor.

9. The 4T SRAM cell of claim 8, wherein the access transistors comprise:
   a first NMOS transistor having a gate, a drain and a source, the drain of the first NMOS transistor being coupled to the drain of the first PMOS transistor; and
   a second NMOS transistor having a gate, a drain and a source, the drain of the second NMOS transistor being coupled to the drain of the second PMOS transistor.

10. The 4T SRAM cell of claim 9, further comprising:
    a word line coupled to the gates of the first and second NMOS transistors;
    a first bit line coupled to the source of the first NMOS transistor; and
    a second bit line coupled to the source of the second NMOS transistor.

11. The 4T SRAM cell of claim 1, further comprising:
    a first bit line coupled to one of the access transistors, and a second bit line coupled to the other one of the access transistors; and
    a regenerative sense amplifier coupled to the first and second bit lines.

12. The 4T SRAM cell of claim 11, wherein the regenerative sense amplifier comprises:
    a pair of cross coupled inverters; and
    a first transistor coupled between the inverters and a voltage supply terminal.

13. The 4T SRAM cell of claim 11, further comprising:
    a first equalization transistor coupled between the first bit line and a ground terminal; and
    a second equalization transistor coupled between the second bit line and a ground terminal.

14. The 4T SRAM cell of claim 11, wherein the regenerative sense amplifier is directly connected to the first and second bit lines.

15. The 4T SRAM cell of claim 1, wherein the first strength is less than the second strength.

16. The 4T SRAM cell of claim 1, wherein the driver transistors are NMOS transistors and the access transistors are PMOS transistors.

17. A four-transistor (4T) static random access memory (SRAM) cell comprising:
    a pair of cross-coupled driver transistors configured to store a data value;
    a pair of access transistors coupled to the pair of cross-coupled driver transistors;
    a pair of complementary bit lines coupled to the pair of access transistors, wherein the driver transistors are less than three times stronger than the access transistors; and
    an equalization circuit coupled to the bit lines, the equalization circuit being configured to maintain the bit lines at ground potential when the 4T SRAM cell is not being accessed.

18. The 4T SRAM cell of claim 17, wherein the driver transistors are PMOS transistors and the access transistors are NMOS transistors.

19. The 4T SRAM cell of claim 17, wherein the driver transistors are not stronger than the access transistors.

20. A four-transistor (4T) static random access memory (SRAM) cell comprising:
   a pair of cross-coupled driver transistors configured to store a data value;
   a pair of access transistors coupled to the pair of cross-coupled driver transistors;
   a pair of complementary bit lines coupled to the pair of access transistors, wherein the driver transistors are less than three times stronger than the access transistors; and
   an equalization circuit coupled to the bit lines, the equalization circuit being configured to maintain the bit lines at a $V_{CC}$ supply voltage when the 4T SRAM cell is not being accessed.

21. The 4T SRAM cell of claim 20, wherein the driver transistors are NMOS transistors and the access transistors are PMOS transistors.

22. The 4T SRAM cell of claim 20, wherein the driver transistors are not stronger than the access transistors.

23. A method of operating a memory comprising the steps of:
   storing a data value in a four transistor (4T) static random access memory (SRAM) cell having a pair of cross coupled driver transistors and a pair of access transistors, wherein the driver transistors are less than three times stronger than the access transistors; and
   equalizing voltages on a pair of bit lines coupled to the pair of access transistors to ground potential when the 4T SRAM cell is not being accessed.

24. The method of claim 23, further comprising the step of maintaining a voltage at a storage node of the 4T SRAM cell at approximately ground potential by sub-threshold leakage current flowing through one of the access transistors.

25. The method of claim 23, further comprising the steps of:
   turning on the access transistors, thereby developing a differential voltage across the bit lines in response to the data value stored in the 4T SRAM cell; and then
   developing a full supply voltage signal across the bit lines in response to the differential voltage using a regenerative sense amplifier.

26. The method of claim 23, wherein the driver transistors are not stronger than the access transistors.

27. A method of operating a memory comprising the steps of:
   storing a data value in a four transistor (4T) static random access memory (SRAM) cell having a pair of cross coupled driver transistors and a pair of access transistors, wherein the driver transistors are less than three times stronger than the access transistors; and
   equalizing voltages on a pair of bit lines coupled to the pair of access transistors to a $V_{CC}$ supply voltage when the 4T SRAM cell is not being accessed.

28. The method of claim 27, further comprising the step of maintaining a voltage at a storage node of the 4T SRAM cell at approximately the $V_{CC}$ supply voltage by sub-threshold leakage current flowing through one of the access transistors.

29. The method of claim 27, further comprising the steps of:
   turning on the access transistors, thereby developing a differential voltage across the bit lines in response to the data value stored in the 4T SRAM cell; and then
   developing a full supply voltage signal across the bit lines in response to the differential voltage using a regenerative sense amplifier.

30. The method of claim 27, wherein the driver transistors are not stronger than the access transistors.

* * * * *